United States Patent
Liu et al.

(10) Patent No.: US 10,340,025 B2
(45) Date of Patent: Jul. 2, 2019

(54) DATA-STORAGE DEVICE AND BLOCK-RELEASING METHOD

(71) Applicant: Silicon Motion, Inc., Jhubei, Hsinchu County (TW)

(72) Inventors: Pin-Chang Liu, Kaohsiung (TW); Tai-Yu Tsou, Hengshan Township, Hsinchu County (TW); Yi-Ming Liu, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 15/863,887

(22) Filed: Jan. 6, 2018

(65) Prior Publication Data
US 2018/0254092 A1    Sep. 6, 2018

(30) Foreign Application Priority Data
Mar. 3, 2017    (TW) .............................. 106106973 A (51) Int. Cl.
*G11C 29/00* (2006.01)
*G11C 29/44* (2006.01)
*G11C 29/52* (2006.01)
*G11C 29/38* (2006.01)

(52) U.S. Cl.
CPC ............ *G11C 29/838* (2013.01); *G11C 29/38* (2013.01); *G11C 29/44* (2013.01); *G11C 29/52* (2013.01)

(58) Field of Classification Search
CPC ........ G11C 29/838; G11C 29/44; G11C 29/52
See application file for complete search history.

(56) References Cited

U.S. PATENT DOCUMENTS

| 9,418,700 | B2 | 8/2016 | Ramanujan et al. |
| 9,483,395 | B2 | 11/2016 | Sreekandath et al. |
| 2001/0052093 | A1* | 12/2001 | Oshima ................ G11C 29/56 714/719 |
| 2004/0080998 | A1* | 4/2004 | Chang ................... G11C 29/26 365/200 |
| 2004/0111553 | A1* | 6/2004 | Conley ............... G06F 12/0246 711/103 |
| 2010/0235605 | A1 | 9/2010 | Perry et al. |
| 2010/0306583 | A1 | 12/2010 | Kim et al. |

FOREIGN PATENT DOCUMENTS

TW             I530957 B         4/2016

* cited by examiner

*Primary Examiner* — Joseph D Torres
(74) *Attorney, Agent, or Firm* — McClure, Qualey & Rodack, LLP (57) ABSTRACT

The present invention provides a data-storage device. The data-storage device includes a flash memory and a controller. The flash memory has a plurality of blocks and each of the blocks has a plurality of pages. The blocks include a plurality of bad blocks that are labeled as damaged. The controller selects one of the bad blocks as a test block, and reads the pages in the test block to determine whether the pages in the test block are damaged. When all the pages in the test block are undamaged, the controller labels the test block as a spare block.

15 Claims, 7 Drawing Sheets

DATA-STORAGE DEVICE AND BLOCK-RELEASING METHOD

CROSS REFERENCE TO RELATED APPLICATIONS

This Application claims priority of Taiwan Patent Application No. 106106973, filed on Mar. 3, 2017, the entirety of which is incorporated by reference herein.

BACKGROUND OF THE INVENTION

Field of the Invention

The present invention relates to a data-storage device and in particular to a data-storage device and block-releasing method thereof.

Description of the Related Art

Flash memory is a widely used non-volatile data-storage medium, using electrical methods to erase and program itself. Taking NAND Flash as an example, it is often used in storage mediums such as memory cards, USB flash devices, solid state devices (SSDs), embedded multimedia cards (eMMCs), etc.

The storage array of a flash memory (e.g. NAND flash) includes a plurality of blocks and each of the blocks has a plurality of pages arranged to store data. Since the flash memory has a limited number of blocks, it has become an important topic to effectively use the blocks in the flash memory.

BRIEF SUMMARY OF THE INVENTION

A detailed description is given in the following embodiments with reference to the accompanying drawings.

The present invention provides a data-storage device. The data-storage device includes a flash memory and a controller. The flash memory has a plurality of blocks and each of the blocks has a plurality of pages. The blocks include a plurality of bad blocks that are labeled as damaged. The controller selects one of the bad blocks as a test block, and reads the pages in the test block to determine whether the pages in the test block are damaged. When all the pages in the test block are undamaged, the controller labels the test block as a spare block.

In an embodiment, the controller selects, as the test block, one of the bad blocks that has been labeled damaged for the longest time. In another embodiment, the controller selects, as the test block, one of the bad blocks that has been labeled damaged for the longest time and that has not been selected as the test block for a predetermined period.

In yet another embodiment, when a predetermined condition is satisfied, the controller selects the test block from the bad blocks, reads the pages in the test block to determine whether the pages in the test block are damaged, and labels the test block as the spare block, wherein the predetermined condition indicates that the number of bad blocks exceeds a predetermined number. In another embodiment, the predetermined condition further indicates that the data-storage device has received a read command from a host.

In an embodiment, when all the pages in the test block are undamaged, the controller moves valid data in the test block to other blocks in the blocks before labeling the test block as the spare block. When any of the pages in the test block is damaged, the controller stops reading other pages in the test block, and maintains the "damaged" labeling on the test block. In addition, the controller does not write data into the bad blocks that are labeled as damaged, and the controller writes data into the blocks that are labeled as spare blocks.

The present invention provides a block-releasing method applied to a data-storage device. The data-storage device comprises a flash memory. The flash memory comprises a plurality of blocks. Each of the blocks comprises a plurality of pages. The blocks comprise a plurality of bad blocks that are labeled as damaged. The method includes the following steps: selecting one of the bad blocks as a test block; reading the pages in the test block to determine whether the pages in the test block are damaged; and labeling the test block as a spare block when all the pages in the test block are undamaged.

In an embodiment, one of the bad blocks, that has been labeled damaged for the longest time, is selected as the test block. In another embodiment, one of the bad blocks that has been labeled damaged for the longest time and that has not been selected as the test block, is selected as the test block.

In an embodiment, the block-releasing method further includes: moving valid data in the test block to other blocks in the blocks before labeling the test block as the spare block. In addition, when a predetermined condition is satisfied, selecting the test block from the bad blocks, reading the pages in the test block to determine whether the pages in the test block are damaged, and labeling the test block as the spare block, wherein the predetermined condition indicates that the number of bad blocks exceeds a predetermined number. In another embodiment, the predetermined condition further indicates that the data-storage device is idling or the data-storage device has received a read command from a host.

In addition, when any of the pages in the test block is damaged, the block-releasing method further comprises: stopping the reading of other pages in the test block, and maintaining the damaged labeling on the test block.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
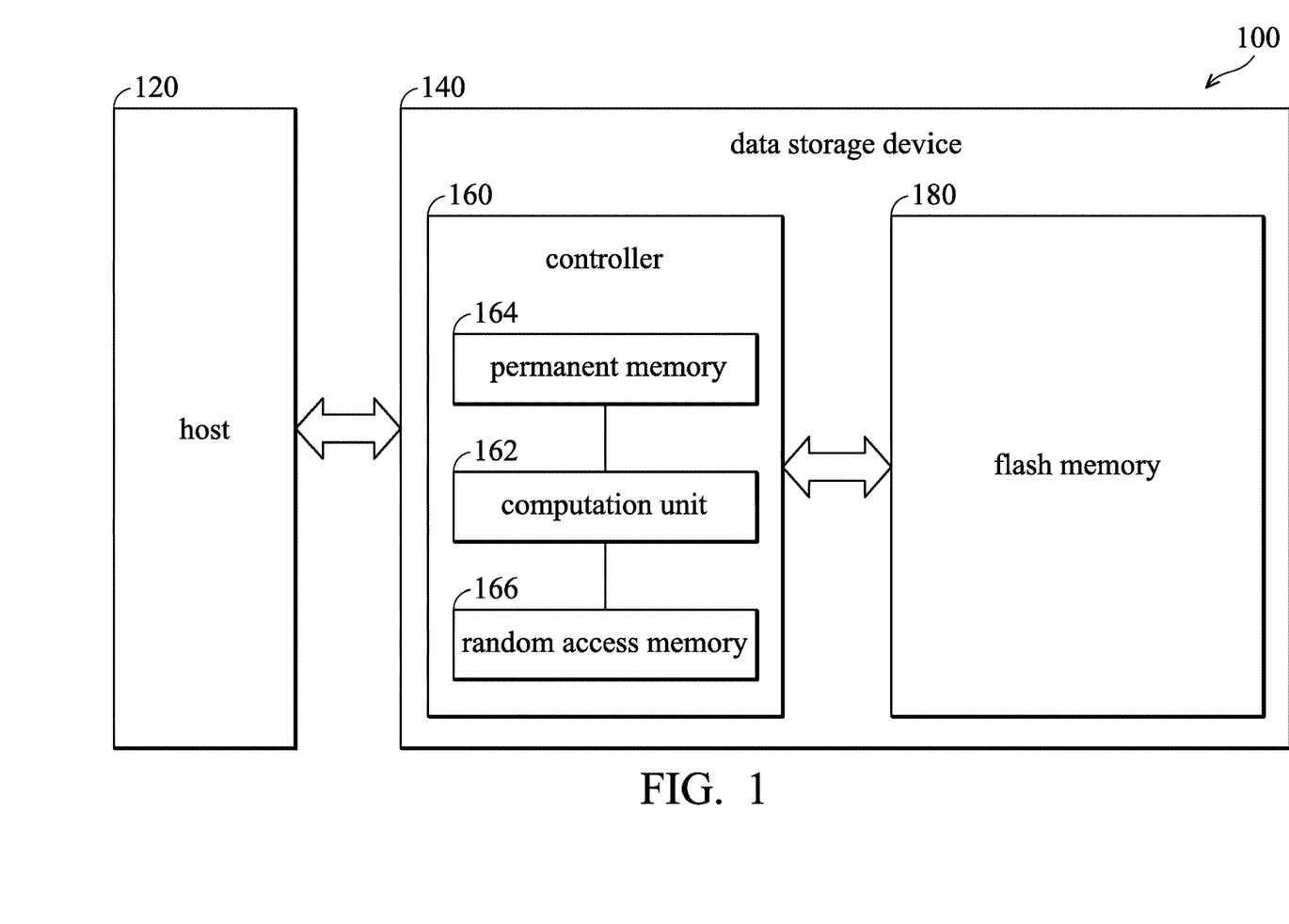
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data-storage device 140. The data-storage device 140 includes a flash memory 180 and a controller 160 arranged to operate in response to the commands of the host 120. The controller 160 includes a computation unit 162 and a permanent memory 164, such as a read-only memory (ROM), and a random access memory (RAM) 166. The permanent memory 164 and the program code and data stored in the permanent memory 164 constitute firmware executed by the computation unit 162, and the controller 160 is configured to control the flash memory 180 based on the firmware. The random access memory 166 is configured to load program codes and parameters that are provided to the controller 160 to perform associated actions based on the program codes and parameters.

Figure 2:
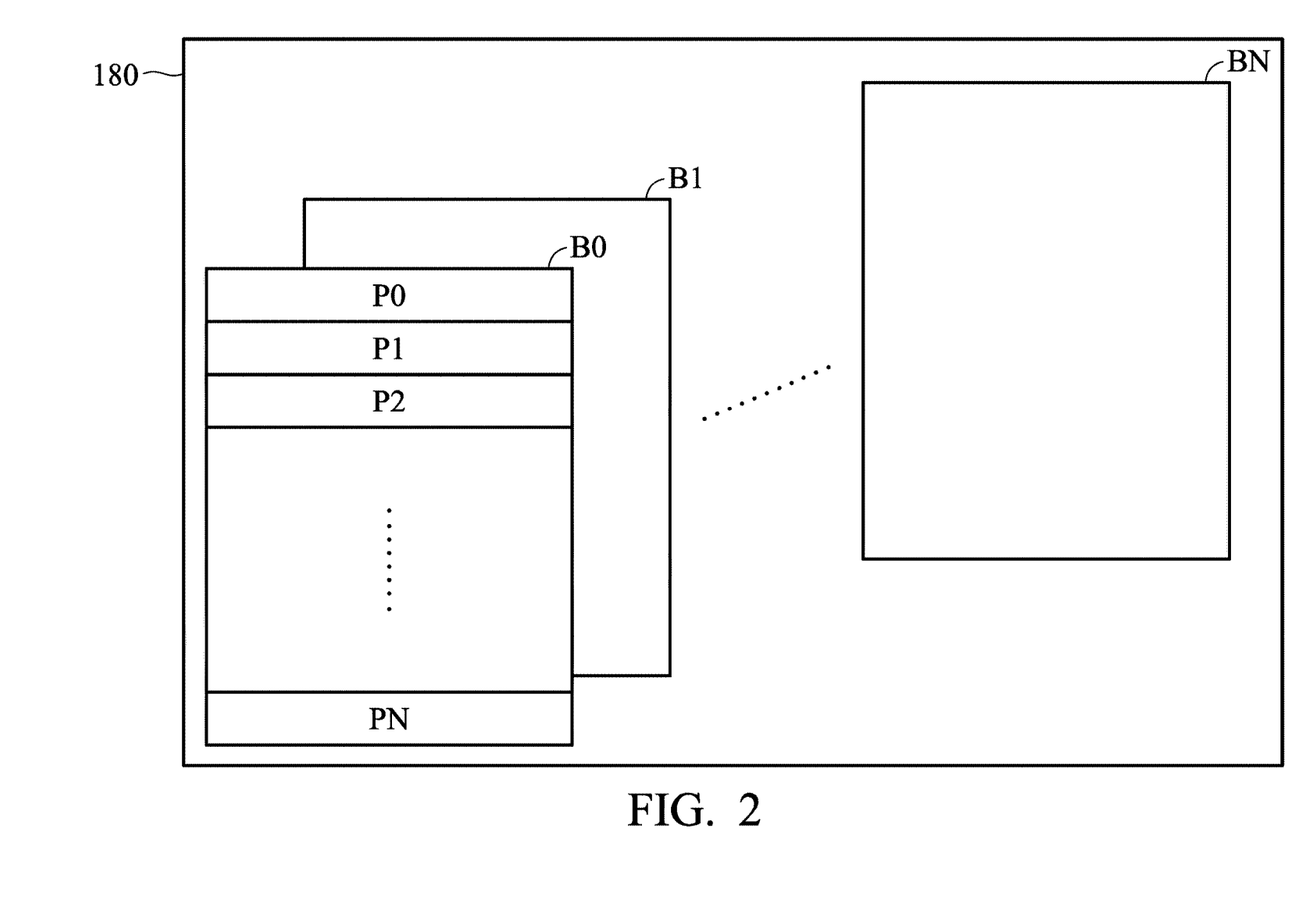
FIG. 2 is a diagram of a flash memory in accordance with an embodiment of the invention.

FIG. 2 is a diagram of a flash memory in accordance with an embodiment of the invention. The flash memory 180 includes a plurality of blocks B0~BN, and each of the blocks B0~BN includes a plurality of pages P0~PN. The controller writes data into the flash memory 180 in a basis of a page, and erases data in the flash memory 180 in a basis of a block.

It should be noted that some of the pages in the flash memory 180 may be not capable of correctly providing the stored data due to temperature variations or an increased amount of read/write operations. Accordingly, in order to protect the data stored in the flash memory, the controller may encode the data to generate an error correction code (ECC) before writing the data into the pages P0~PN. Then, the controller 160 may write the data and the corresponding ECC to the flash memory. When reading data from the flash memory, the controller 160 may determine whether the data read from the flash memory is correct according to the ECC. When there are error bits in the data retrieved from the flash memory 180, the controller 160 may correct the error bits in the data retrieved from the flash memory according to the ECC. However, when the controller 160 is not capable of correcting the error bits according to the ECC or other methods, the controller 160 will label the block storing the data as a bad block.

Specifically, there are three types of blocks in the blocks B0~BN, such as bad blocks, spare blocks, and data blocks. Bad blocks indicate the blocks that are labeled as "damaged". Spare blocks are blocks that do not store valid data. Data blocks are blocks that store valid data. In other words, data cannot be written into the bad blocks in the blocks B0~BN, but data can be written into the spare blocks in the blocks B0~BN. When the number of bad blocks in the block B0~BN is increased, it indicates that the number of spare blocks and data blocks in the block B0~Bn is decreased. When the number of bad blocks in the blocks B0~BN exceeds a predetermined number, it may cause a "run out of spares (ROS)" situation. Data cannot be further written into the data-storage device 140 in an ROS situation.

However, under some conditions, it is possible to recover a bad block to a normal block. In other words, it is possible for a bad block to correctly provide the stored data due to changes in circumstances and time. Accordingly, in an embodiment, the controller 160 may select one of the bad blocks as a test block when a predetermined condition is satisfied. The controller 160 may read a page in the test block to determine whether the page in the test block is damaged. When the data in the page read from the test blocks are correct or can be corrected to correct data, the controller 160 determines that the page is undamaged. When the data read from the page in the test block cannot be corrected to valid data, the controller 160 determines that the page in the test block is damaged. In an embodiment, the predetermined condition may be set in which the number of bad blocks exceeds a predetermined number, but the invention is not limited thereto. The predetermined number can be decided by the circuit designer, such as the predetermined number being one third of the total number of blocks B0~BN, but the invention is not limited thereto. In another embodiment, the predetermined condition can be set in which the number of bad blocks exceeds a predetermined number and the data-storage device 140 is idling. In yet another embodiment, the predetermined condition can be set in which the data-storage device 140 has received a read command or a write command from the host 120. In addition, during the procedure of executing a write command or a read command, the controller 160 may only select one test block for testing, but the invention is not limited thereto. In other embodiments, the circuit designer may adjust the number of test blocks for each command according to need.

When all pages in the test block are undamaged, the controller 160 labels the test block as a spare block, and releases the bad block which was previously selected as the test block. In other words, when all pages in the test block are undamaged, the bad block being used as the test block will be used as a spare block or a data block by the controller 160, thereby increasing the number of spare blocks in the blocks B0~BN. In an embodiment, the controller 160 may select one of the bad blocks that has been damage for the longest time as the test block, but the invention is not limited thereto. In another embodiment, the controller 160 selects one of the bad blocks as the test block, wherein the bad block selected had been labeled damaged for the longest period and had not been selected as a test block. In other words, when there is a damage page in the selected bad block after testing, the selected bad block will not be tested again within a predetermined period. In addition, there is a specific block for storing the status of each of the blocks B0~BN in the flash memory 180. When the predetermined condition is satisfied, the controller 160 may read the data in the specific block to retrieve the information about which block in the blocks B0~BN is a bad block and the labeled time of the status, and the controller 160 further selects the test block according to the retrieved information, but the invention is not limited thereto. In other embodiments, the labeled time of the bad block can be recorded in other blocks other than the specific block.

In another embodiment, when all pages in the test block are undamaged, the controller 160 further determines whether there is valid data in the test block. If there is valid data in the test block, the controller 160 may move the valid data from the test block to other blocks to recover the data that had previously been lost. After the valid data have been moved from the test block to other blocks, the controller 160 labels the test block as a spare block. In another embodiment, before determining whether there is valid data in the test bock, the controller 160 further updates the information about the bad block being the test block, such as a valid page count, an erase count, and a read count. The valid page count, the erase count, and the read count can be separately stored in different tables or stored in the same table. In other words, the flash memory 180 includes at least one table for storing the valid page count, the erase count, and the read count of each of the blocks B0~BN.

When any page of the test block is damaged, the controller 160 stops reading other pages in the test blocks and maintains the "damaged" labeling on the test block. In other words, when the controller 160 founds any page in the test block being damaged, the controller 160 will not read other pages in the test block, and determines that the test block is still a bad block.

Figure 3:
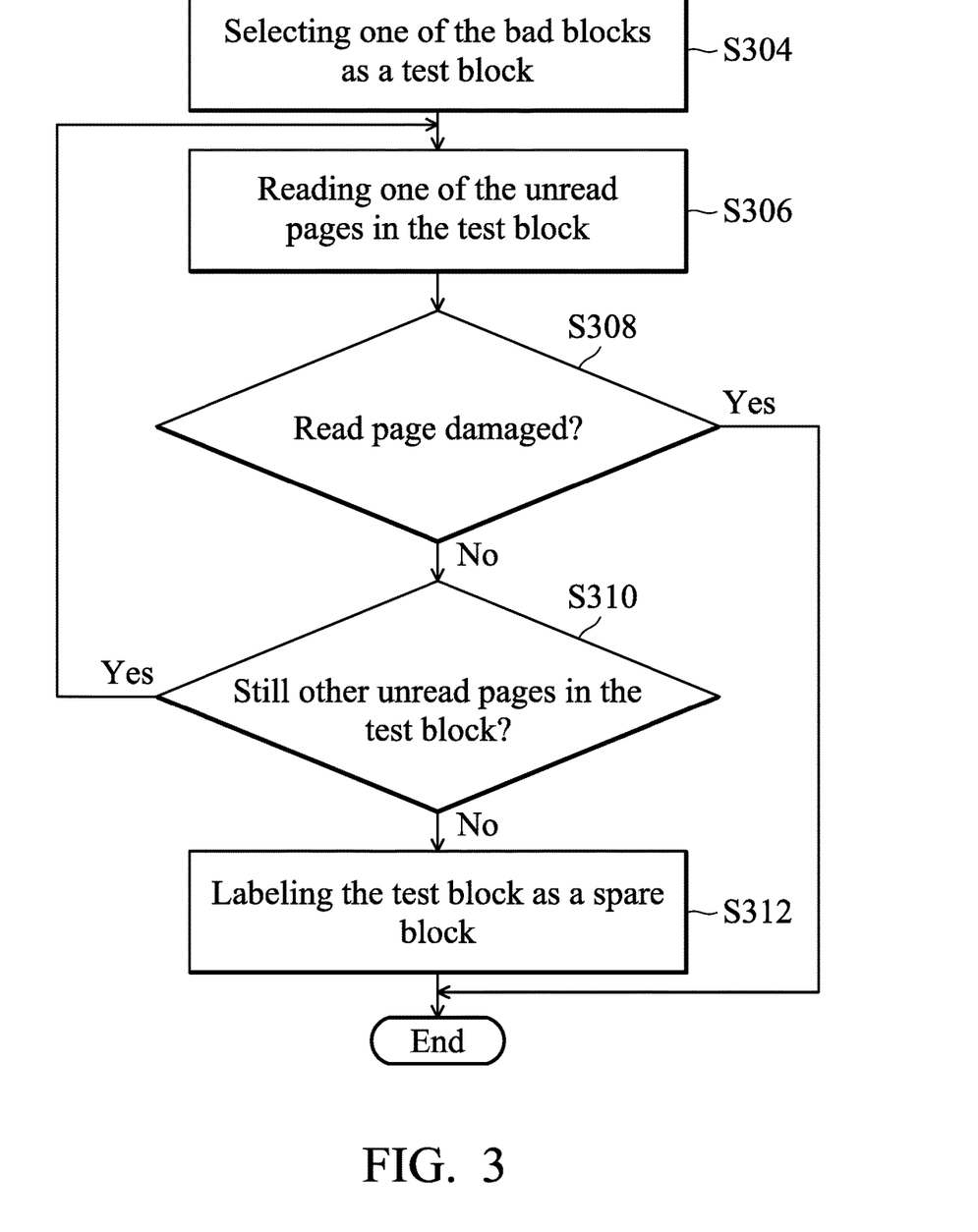
FIG. 3 is a flow chart of a block-releasing method in accordance with an embodiment of the invention.

FIG. 3 is a flow chart of a block-releasing method in accordance with an embodiment of the invention. The block-releasing method can be applied to the data-storage device 140 shown in FIG. 1, wherein the flash memory 180 includes a plurality of blocks, and each block includes a plurality of pages. A plurality of blocks in flash memory 180 is labeled as bad blocks. The flow starts at step S304.

In step S304, the controller 160 selects one of the bad blocks as a test block. In an embodiment, the controller 160 may select, as the test block, one of the bad blocks that has been damaged for the longest time, but the invention is not limited thereto. In another embodiment, the controller 160 selects, as the test block, one of the bad blocks that has been labeled damaged for the longest period and that has not been selected as a test block. In other words, when there is a damage page in the selected bad block after testing, the selected bad block will not be tested again within a predetermined period. In addition, there is a specific block for storing the status of each of the blocks B0~BN in the flash memory 180. When the predetermined condition is satisfied, the controller 160 may read the data in the specific block to retrieve the information about which block in the blocks B0~BN is a bad block and the labeled time of the status, and the controller 160 further selects the test block according to the retrieved information, but the invention is not limited thereto. In other embodiments, the labeled time of the bad block can be recorded in other blocks other than the specific block.

In step S306, the controller reads one of the unread pages in the test block. In an embodiment, the controller 160 may sequentially read the pages in the test block according to the order of pages, but the invention is not limited thereto. In addition, when a page in the test block does not store valid data, the controller 160 will not read the page, wherein the controller 160 may determine whether each page has valid data according to the metadata of each page.

In step S308, the controller 160 determines whether the read page is damaged according to the reading result. Specifically, when the data in the read page is correct or can be corrected to correct data, the controller 160 determines that the read page is undamaged. When the data in the read page cannot be corrected to correct data, the controller 160 determines that the read page is damaged. When the read page is damaged, the flow ends in step S308. When the read page is undamaged, step S310 is performed.

In step S310, the controller 160 determines whether there are still other unread pages in the test block. When there are still other unread pages in the test block, the flow goes back to step S306, and the controller 160 continues to select one of the unread pages for testing. When there are no unread pages in the test block, step S312 is performed.

In step S312, the controller 160 labels the test block as a spare block. In other words, when all pages in the test block are undamaged, the bad block that is used as the test block will be labeled as a spare block or a data block by the controller 160, thereby increasing the number of spare blocks in the blocks B0~BN. In an embodiment, in step S312, the controller 160 further moves the valid data in the test block to other blocks to recover the data that had previously been lost. After the valid data have been moved from the test block to other blocks, the controller 160 labels the test block as a spare block. In another embodiment, before determining whether there is valid data in the test bock, the controller 160 further updates the information about the bad block being the test block, such as a valid page count, an erase count, and a read count. The flow in FIG. 3 ends at step S312.

Figure 4:
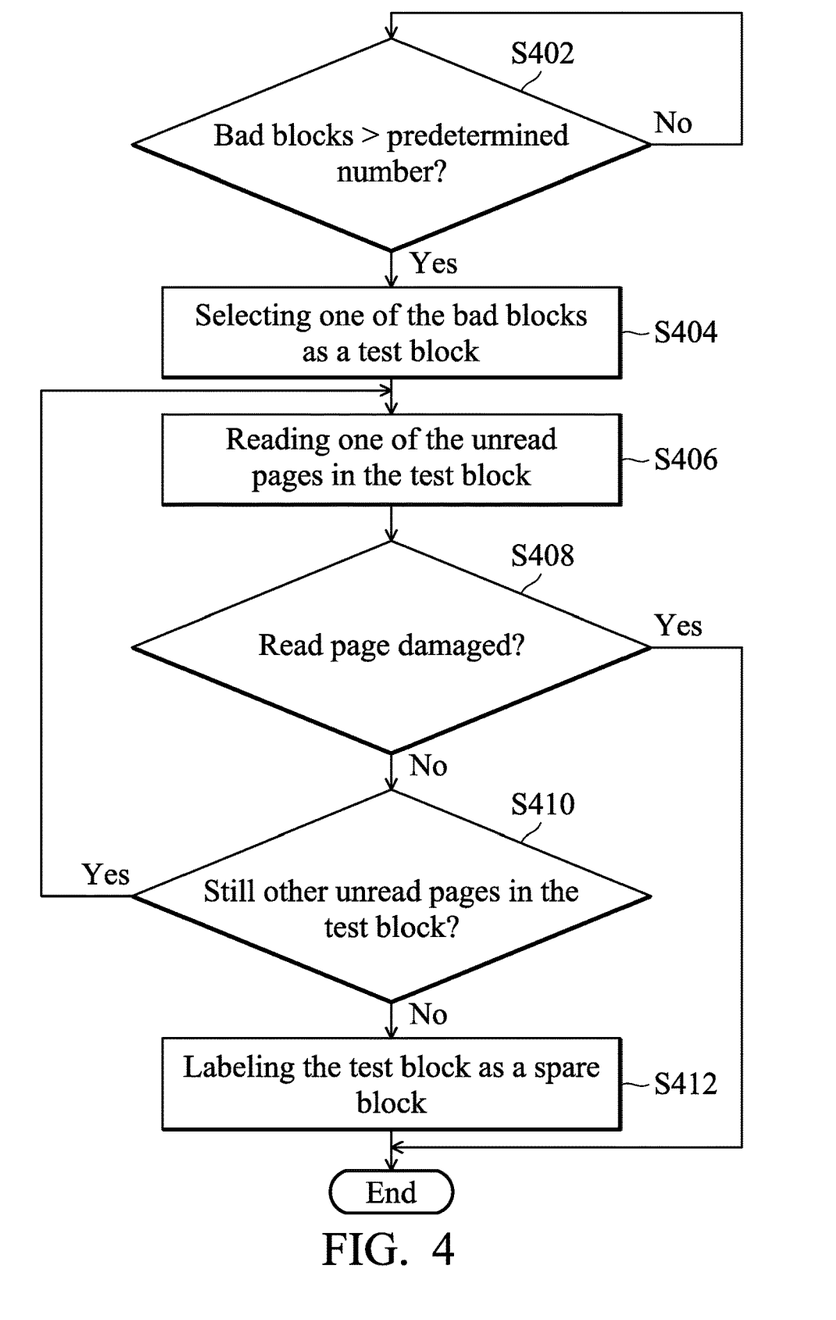
FIG. 4 is a flow chart of a block-releasing method in accordance with another embodiment of the invention.

FIG. 4 is a flow chart of a block-releasing method in accordance with another embodiment of the invention. The block-releasing method in FIG. 4 can be applied to the data-storage device 140 in FIG. 1. The flow of the block-releasing method in FIG. 4 is similar to that of the block-releasing method in FIG. 3, and the difference between the flows of FIG. 3 and FIG. 4 is that the flow in FIG. 4 further includes step S402. Accordingly, steps S404~S412 can be referred to steps S304~S312 in the embodiment of FIG. 3, and the details will be omitted here. The flow in FIG. 4 starts at step S402. In step S402, the controller 160 determines whether the number of bad blocks in the blocks B0~BN is greater than a predetermined number. When the number of bad block in the blocks B0~BN is greater than the predetermined number, step S404 is performed. When the number of bad block in the blocks B0~BN is not greater than the predetermined number, the controller 160 performs step S402 after a predetermined period, and re-determines whether the number of bad blocks is greater than the predetermined number.

Figure 5A:
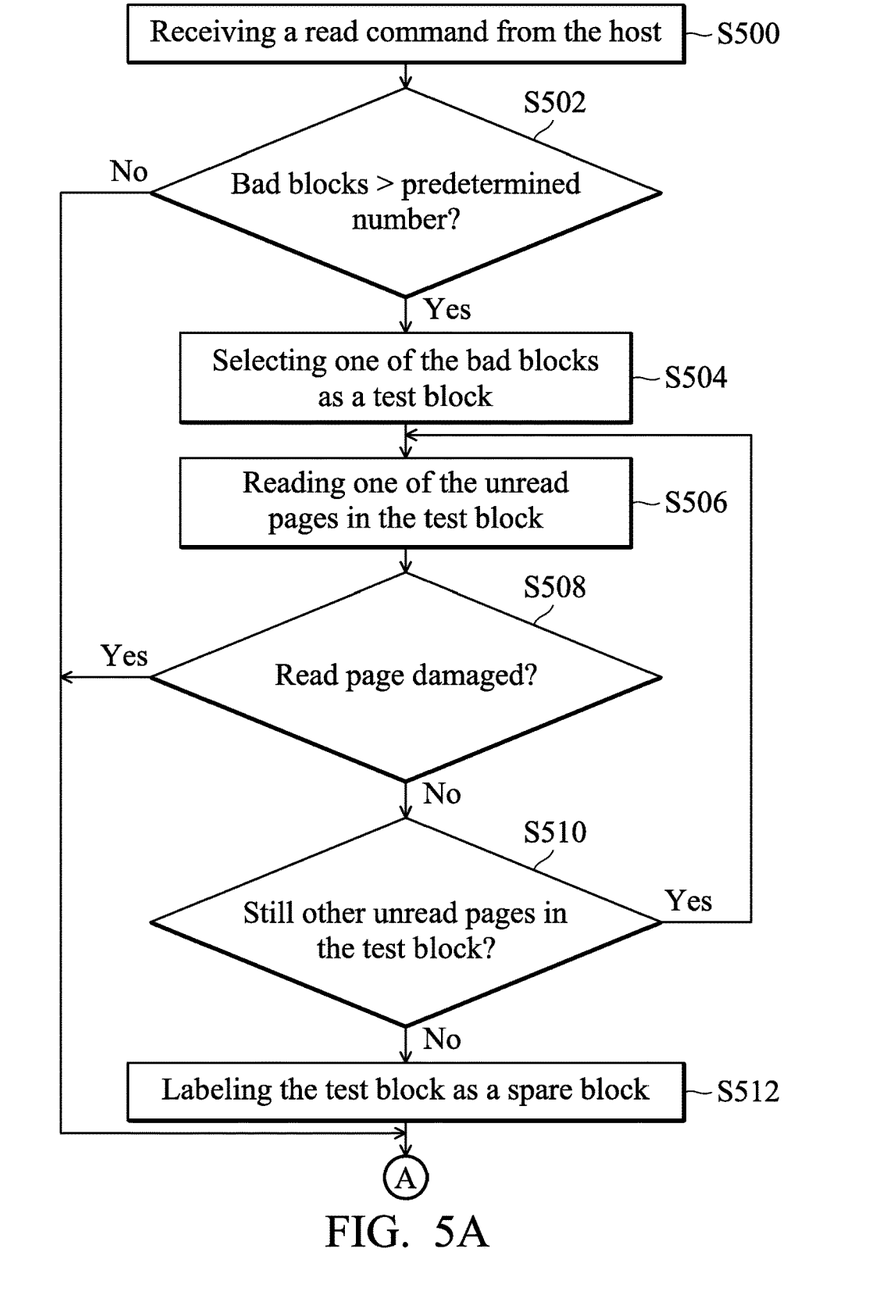
FIGS. 5A and 5B are portions of a flow chart of a block-releasing method in accordance with yet another embodiment of the invention.
Figure 5B:
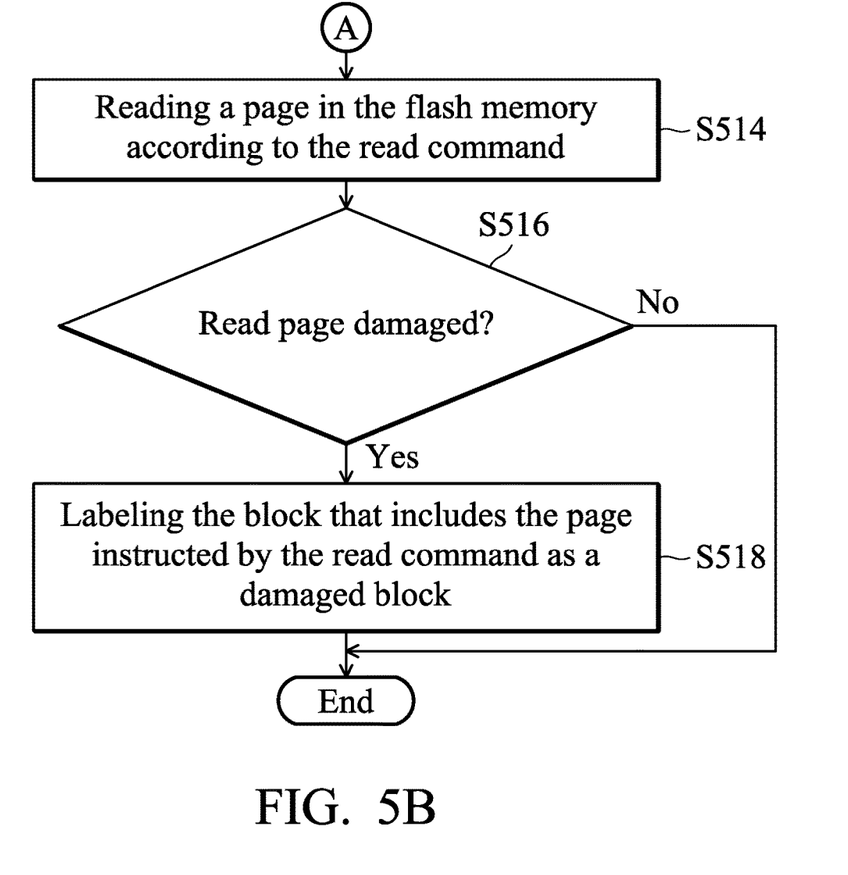

FIGS. 5A and 5B are portions of a flow chart of a block-releasing method in accordance with yet another embodiment of the invention. The block-releasing method in FIGS. 5A-5B can be applied to the data-storage device 140 in FIG. 1. The flow of the block-releasing method in FIGS. 5A-5B is similar to that of the block-releasing method in FIG. 4, and the difference between the flows of FIG. 4 and FIGS. 5A-5B is that the flow in FIGS. 5A-5B further includes step S500 and steps S514~S518. Accordingly, steps S502~S512 can be referred to the description about step S402 and steps S304~S312, and the details will be omitted here. The flow in FIGS. 5A-5B starts at step S500.

In step S500, the controller 160 receives a read command from the host 120. Then, the flow proceeds to step S502.

In step S514, the controller 160 read pages of the flash memory 180 according to the read command. It should be noted that the page read by the controller 160 is designated by the read command, and is different from that in step S506.

Then, in step S516, the controller 160 determines whether the page being read is damaged according to the read command. Specifically, when the data in the read page is correct or can be corrected to correct data, the controller 160 determines that the read page is undamaged. When the data in the read page cannot be corrected to correct data, the controller 160 determines that the read page is damaged. When the read page is damaged, the flow ends at step S518. When the read page is undamaged, the flow ends at step S516.

In step S518, the controller 160 labels the block that includes the page directed by the read command as a damaged block. The flow in FIGS. 5A-5B ends at step S518.

Figure 6:
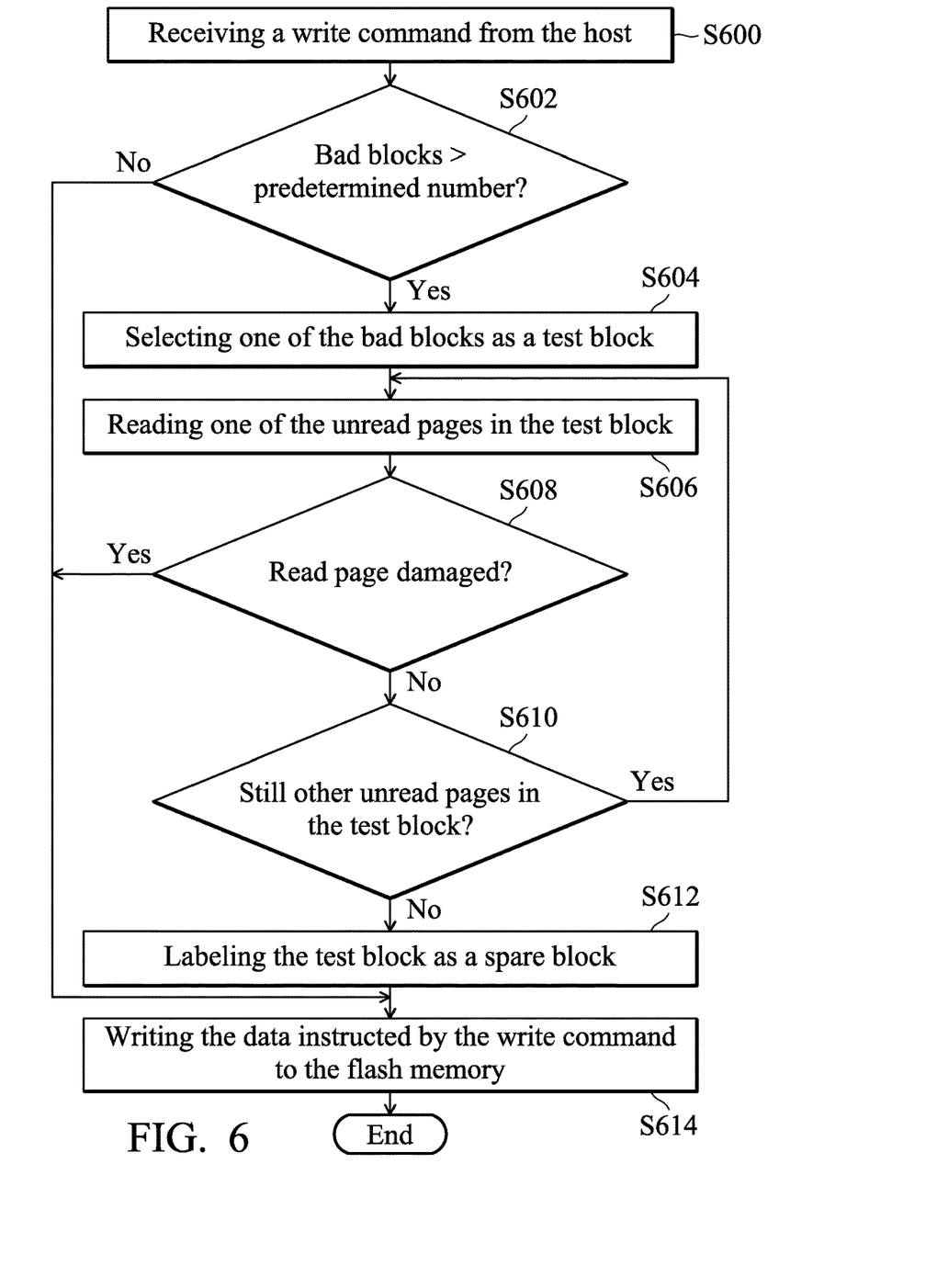
FIG. 6 is a flow chart of a block-releasing method in accordance with yet another embodiment of the invention.

FIG. 6 is a flow chart of a block-releasing method in accordance with yet another embodiment of the invention. The block-releasing method in FIG. 6 can be applied to the data-storage device 140 in FIG. 1. The flow of the block-releasing method in FIG. 6 is similar to that of the block-releasing method in FIG. 4, and the difference between the flows of FIG. 6 and FIG. 4 is that the flow in FIG. 6 further includes step S600 and step S614. Accordingly, steps S602~S612 can be referred to the description about step S402 and steps S304~S312, and the details will be omitted here. The flow in FIG. 6 starts at step S600.

In step S600, the controller 160 receives a write command from the host 120. Then, the flow proceeds to step S602.

In step S614, the controller 160 writes the data instructed by the write command into the flash memory. The flow in FIG. 6 ends at step S614.

As described above, the data-storage device 140 and the block-releasing method in the invention are capable of re-using the blocks labeled as damaged.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data-storage device, comprising:
 a flash memory, comprising a plurality of blocks, and each of the blocks comprises a plurality of pages, wherein the blocks comprise a plurality of bad blocks that are labeled as damaged; and
 a controller, configured to select one of the bad blocks as a test block, and read the pages in the test block to determine whether the pages in the test block are damaged,
 wherein when all the pages in the test block are undamaged, the controller labels the test block as a spare block,
 wherein the controller selects as the test block one of the bad blocks that has been labeled damaged for the longest time.

2. The data-storage device as claimed in claim 1, wherein when all the pages in the test block are undamaged, the controller moves valid data in the test block to other blocks in the blocks before labeling the test block as the spare block.

3. The data-storage device as claimed in claim 1, wherein when a predetermined condition is satisfied, the controller selects the test block from the bad blocks, reads the pages in the test block to determine whether the pages in the test block are damaged, and labels the test block as the spare block, wherein the predetermined condition indicates that the number of bad blocks exceeds a predetermined number.

4. The data-storage device as claimed in claim 3, wherein the predetermined condition further indicates that the data-storage device is idling.

5. The data-storage device as claimed in claim 3, wherein the predetermined condition further indicates that the data-storage device has received a read command from a host.

6. The data-storage device as claimed in claim 1, wherein when any of the pages in the test block is damaged, the controller stops reading other pages in the test block, and maintain the damaged labeling on the test block.

7. The data-storage device as claimed in claim 1, wherein the controller does not write data into the bad blocks that are labeled as damaged, and the controller writes data into the blocks that are labeled as spare blocks.

8. A block-releasing method, applied to a data-storage device, wherein the data-storage device comprises a flash memory, the flash memory comprises a plurality of blocks, each of the blocks comprises a plurality of pages, and the blocks comprise a plurality of bad blocks that are labeled as damaged, the method comprising:
 selecting one of the bad blocks as a test block;
 reading the pages in the test block to determine whether the pages in the test block are damaged; and
 labeling the test block as a spare block when all the pages in the test block are undamaged,
 wherein the step of selecting one of the bad blocks as the test block comprises: selecting as the test block one of the bad blocks that has been labeled damaged for the longest time or selecting as the test block one of the bad blocks that has been labeled damaged for the longest time and that has not been selected as the test block.

9. The block-releasing method as claimed in claim 8, further comprising:
 moving valid data in the test block to other blocks in the blocks before labeling the test block as the spare block.

10. The block-releasing method as claimed in claim 8, further comprising:
 when a predetermined condition is satisfied, selecting the test block from the bad blocks, reading the pages in the test block to determine whether the pages in the test block are damaged, and labeling the test block as the spare block,
 wherein the predetermined condition indicates that the number of the bad blocks exceeds a predetermined number.

11. The block-releasing method as claimed in claim 10, wherein the predetermined condition further indicates that the data-storage device is idling.

12. The block-releasing method as claimed in claim 10, wherein the predetermined condition further indicates that the data-storage device has received a read command from a host.

13. The block-releasing method as claimed in claim 8, further comprising:
 when any of the pages in the test block is damaged, stopping the reading of other pages in the test block, and maintaining the damaged labeling on the test block.

14. The block-releasing method as claimed in claim 8, wherein the bad blocks that are labeled as damaged are not capable of being written with data, and the blocks that are labeled as spare blocks are capable of being written with data.

15. A data-storage device, comprising:
 a flash memory, comprising a plurality of blocks, and each of the blocks comprises a plurality of pages, wherein the blocks comprise a plurality of bad blocks that are labeled as damaged; and a controller, configured to select one of the bad blocks as a test block, and read the pages in the test block to determine whether the pages in the test block are damaged, wherein when all the pages in the test block are undamaged, the controller labels the test block as a spare block, wherein the controller selects as the test block one of the bad blocks that has been labeled damaged for the longest time and that has not been selected as the test block for a predetermined period.

* * * * *